(12) United States Patent
Lee et al.

(10) Patent No.: US 7,144,662 B2
(45) Date of Patent: Dec. 5, 2006

(54) PHOTORESIST COMPOSITION HAVING A HIGH HEAT RESISTANCE

(75) Inventors: Dong-Ki Lee, Seoul (KR); Sung-Chul Kang, Seongnam (KR); You-Kyoung Lee, Suwon (KR); Jin-Ho Ju, Seoul (KR)

(73) Assignee: Samsung Electronics Co., Ltd. (KR)

( * ) Notice: Subject to any disclaimer, the term of this patent is extended or adjusted under 35 U.S.C. 154(b) by 157 days.

(21) Appl. No.: 10/493,193

(22) PCT Filed: Feb. 20, 2002

(86) PCT No.: PCT/KR02/00272

§ 371 (c)(1),
(2), (4) Date: Apr. 19, 2004

(87) PCT Pub. No.: WO03/034151

PCT Pub. Date: Apr. 24, 2003

(65) Prior Publication Data

US 2004/0253541 A1 Dec. 16, 2004

(30) Foreign Application Priority Data

Oct. 19, 2001 (KR) .............................. 2001-64571

(51) Int. Cl.
*G03F 7/023* (2006.01)
(52) U.S. Cl. .................... 430/18; 430/189; 430/191; 430/192; 430/280.1

(58) Field of Classification Search ................ 430/165, 430/191, 192, 193, 18, 280.1
See application file for complete search history.

(56) References Cited

U.S. PATENT DOCUMENTS

| | | | | |
|---|---|---|---|---|
| 5,362,597 A | * | 11/1994 | Sano et al. .................. | 430/191 |
| 5,372,912 A | | 12/1994 | Allen et al. .................. | 430/270 |
| 5,492,793 A | | 2/1996 | Breyta et al. .......... | 430/270.14 |
| 6,420,464 B1 | * | 7/2002 | Kuboki et al. .............. | 524/109 |
| 6,653,043 B1 | * | 11/2003 | Hanabata ................. | 430/270.1 |
| 2002/0055059 A1 | * | 5/2002 | Nishimura et al. ...... | 430/270.1 |

FOREIGN PATENT DOCUMENTS

KR   2001-0085203   9/2001

* cited by examiner

*Primary Examiner*—John S. Chu
(74) *Attorney, Agent, or Firm*—Cantor Colburn LLP

(57) ABSTRACT

The present invention relates to a photoresist composition having high heat resistance used in the production process of an LCD, and more particularly, to a photoresist composition having high heat resistance, capable of decreasing process tact (a way), of process simplification, and of the retrenchment of expenditures. The inventive composition facilitates this through making it possible to skip 5 processes, such as Cr metal deposition forming a metal film, and the photo/etch/PR strip/etch steps of the whole surface of the metal, by substituting the inventive composition for the usual metal film, such that $N^+$ ion doping in production of TFT-LCD can take place due its high heat resistance.

13 Claims, 6 Drawing Sheets

PHOTORESIST COMPOSITION HAVING A HIGH HEAT RESISTANCE

BACKGROUND OF THE INVENTION (a) Field of the Invention

The present invention relates to a photoresist composition, and more particularly to a photoresist composition that can endure heat of a high temperature in a photo process progressing pattern formation during LCD-TFT panel production.

(b) Description of the Related Art

The polymers used in photoresists for LCDs are divided into a nega-type and a posi-type according to solubility characteristics of the exposure part and the non-exposure part. The photoresists embody a resolution of 0.3 μm or more as a result of improved solubility characteristics due to various studies on molecular weight distribution, the meta/para ratio of cresol, conjugation position of methylene groups, ester bonds of photoactive compounds, component ratios, etc.

The performance development of photoresists (PR) used in the photo process progressing pattern formation during LCD-TFT panel production is a very important matter in determining production line output.

Presently, an $N^+$ ion doping process, and a metal and nitride dry etch process of Poly process at a low temperature in a mass production line uses a metal film and a photoresist as a mask.

In the case of an $N^+$ ion doping process, if the metal film used in the mask is substituted for the PR used before the process, the deposition process of the metal film is eliminated, and therefore process simplification and productivity improvement can be obtained.

However, since the photoresist has a heat resistance of about 130° C., if the photoresist is applied in a dry etch process, the PR burns because of the extreme heat and plasma of the process due to the high power of the dry etch equipment, and even after the full ashing process, stripping does not occur properly, and in the case of the metal dry etch damage occurs. In order to solve this problem, the related art uses a hard bake process again after the photo process, and then performs ashing and dry etching.

That is, the positive photoresist currently used does not undergo an ion doping process at a high temperature, and thus there is a concern about flowing. Also, as mentioned, when a nitride dry etch process such as with metal, silicon nitride, and a third layer film (SiNx/a-Si/n+ a-Si) progresses, it does not play an effective role as a mask due to the burning phenomenon of the photoresist. Accordingly, in order to solve the burning phenomenon, the photo process progresses, and then the hard bake process is performed again, but the process is difficult to carry out because of intermittent residue that occurs in the PR pattern image at the glass edge, and process progression is impossible due to the burning phenomenon of the PR even in the multi-metal layer metal dry etch process (Mo/Al—Nd or Mo/Al—Nd/Mo).

Therefore, development of a new photoresist having superior heat resistance, capable of enduring heat of a high temperature (about 160° C.), is needed.

SUMMARY OF THE INVENTION

The present invention was made in consideration of the problems of the prior art, and it is an object of the present invention to provide a photoresist composition that has high heat resistance and superior performance to use in the photo process for pattern formation during LCD-TFT panel production.

It is another object of the present invention to provide a photoresist composition with which the hard bake process can be skipped, and one in which, after the ashing process, can be stripped without the burning phenomenon of the photoresist even after dry etching.

In order to achieve the objects, the preset invention provides a photoresist composition comprising:

(a) 10 to 50 wt % of novolak resin;

(b) 1 to 20 wt % of epoxy acrylate resin;

(c) 3 to 15 wt % of a photoactive compound; and (d) 50 to 80 wt % of solvent.

The present invention also provides a photoresist composition comprising:

(a) 1.0 to 50 wt % of novolak resin;

(b) 0.05 to 20 wt % of salt of p-toluene sulfonic acid/pyridine;

(c) 3 to 15 wt % of a photoactive compound; and (d) 50 to 80 wt % of solvent.

Furthermore, the present invention provides a semiconductor device comprising the photoresist composition as a mask in an $N^+$ ion doping process in a low Poly process.

Furthermore, the present invention provides a semiconductor device comprising the photoresist composition as a mask of the metal and nitride dry etch process.

DETAILED DESCRIPTION AND THE PREFERRED EMBODIMENTS

Figure 1A:
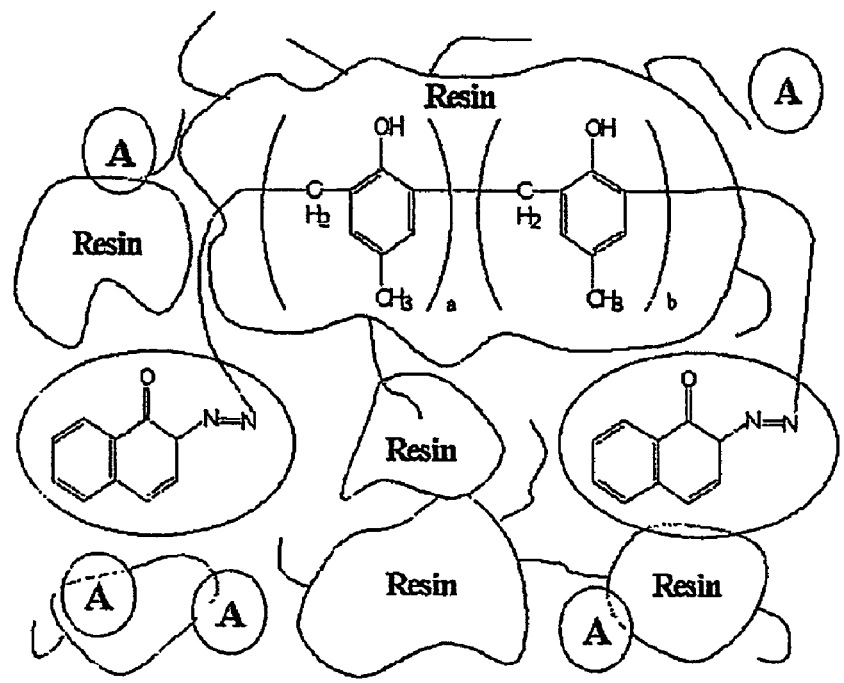
FIG. 1 shows a high sensitivity phenomenon mechanism according to adding PPTS (salts of p-toluene sulfonic acid/pyridine) of the photoresist composition of the present invention.

The present invention will now be explained in more detail.

In order to solve problems of the related art, the present inventors worked for a heat resistance improvement by introducing an epoxy acrylate resin to the photoresist composition of the related art comprising a novolak-based alkali soluble resin. In particular, they prepared a photoresist composition with improved heat resistance through setting sensitivity and retention level of a general photoresist composition by adding PPTS (salt of P-Toluene Sulfonic Acid/Pyridine) in order to prevent low sensitivity and a retention decrease.

Accordingly, the present invention provides a photoresist composition that maintains both photo speed and coating uniformity compared with the general art, and wherein heat resistance is improved.

The first resin used in the present invention is an alkali soluble resin, and it is preferably an (a) novolak-based resin. The novolak-based resin is prepared by polycondensation of phenol-based and aldehyde-based compounds. The phenol-based compound can use at least one selected from the group consisting of phenol, m-cresol, and p-cresol, etc. The aldehyde-based compound can use formaldehyde, benzaldehyde, acetaldehyde, etc. The condensation reaction of phenol-based and aldehyde-based compounds can use a general acidic catalyst.

In the present invention, the novolak resin can increase retention and sensitivity by mixing novolak resin of another kind prepared according to a mixing ratio of m-cresol and p-cresol. Preferably, the novolak resin uses a resin having an average molecular weight (novolak A resin) of 3,000 to 15,000 and a resin having an average molecular weight (novolak B resin) of 5,000 to 15,000, or a mixture thereof. More preferably, the novolak resin is a mixture of novolak A resin and novolak B resin. The novolak A resin is polymerized m-cresol and p-cresol in the weight ratio of 50 to 100:20 to 80. The novolak B resin is polymerized m-cresol and p-cresol in the weight ratio of 30 to 100:40 to 100. The mixing ratio of novolak A resin and novolak B resin is preferably in the weight ratio of 1:1 to 9.

The content of the novolak resin is preferably 10 to 50 wt %, and if the content is outside this scope, retention and sensitivity cannot be obtained.

Furthermore, the photoresist composition of the present invention improves heat resistance by comprising a (b) epoxy acrylate resin as a second resin. The epoxy acrylate resin has a fast dissolution and superior heat resistance, and thus it can improve performance of the photoresist. The content of epoxy acrylate resin is 1 to 20 wt %, and if the content is less than 1 wt %, the effectiveness of heat resistance is not sufficient, and if the content is above 20 wt %, retention and sensitivity can be reduced.

Furthermore, the present invention can maintain the heat resistance improvement of the general novolak A and B resin by using (b) PPTS (salts of p-toluene sulfonic acid/pyridine) instead of the epoxy acrylate-based resin as the second resin, and it can also maintain the heat resistance of before addition of the PPTS by solving the problem of a large drop in sensitivity. That is, the PPTS plays a role in preventing a low sensitivity and retention reduction, as well as in heat resistance maintenance (of 160° C).

Furthermore, the PPTS plays a role in promoting solubility of the novolak resin by producing acid ($H^+$) during exposure, and it has a low molecular weight and a high sensitivity effect that increases because of the solubility property increase due to the stone wall effect. In addition, the greatest strong point of the PPTS is that retention is maintained in spite of is high sensitivity. This solves the retention change problem (if retention improves, the sensitivity is diminished) because of its high molecular weight:low molecular weight ratio, which is generally an issue in development of a photoresist having high heat resistance.

The content of salts of p-toluene sulfonic acid/pyridiene (PPTS) is preferably 0.05 to 20 wt %, wherein if the content of PPTS is less 0.05 wt %, high sensitivity and retention maintenance is impossible, and if the content of PPTS is above 20 wt %, further improvement of the sensitivity and retention cannot be expected.

Figure 1B:
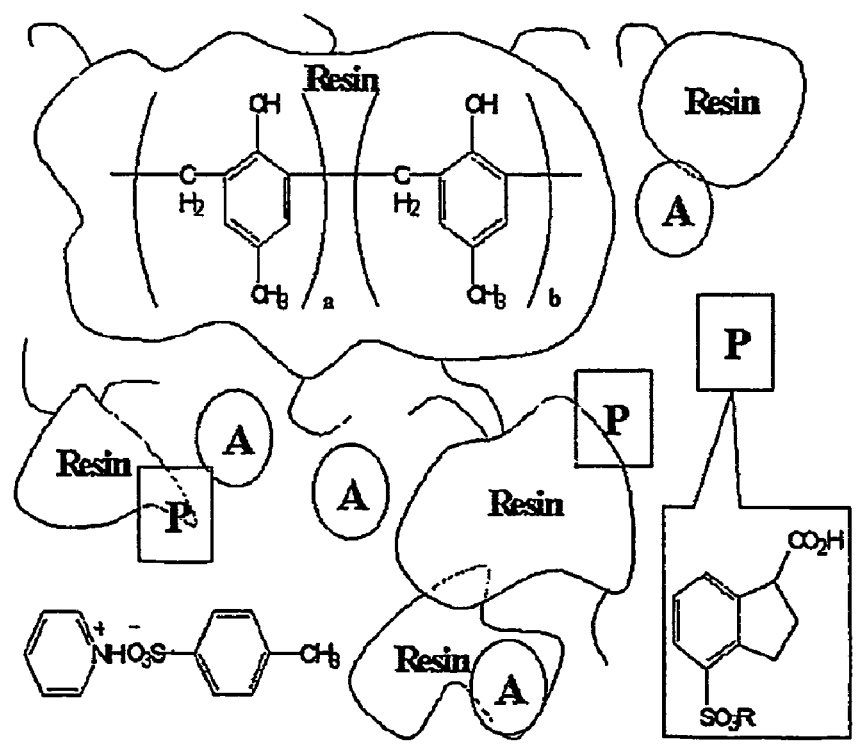

In the photoresist composition of the present invention, FIGS. 1a and 1b show a high sensitivity phenomenon mechanism according to addition of PPTS. FIGS. 1a and 1b show a high sensitivity phenomenon mechanism of a non-exposure part and an exposure part according to addition of PPTS of Example 9. P of the substrate (not shown) in FIG. 1a shows a solubility reduction due to the coupling effect of the photoactive compound. A in FIG. 1b represents results of the sensitivity increase according to a solubility increase because of the activated acid ($H^+$) and the stone wall effect due to a low molecular weight, and P shows a solubility increase according to a chemical solubility change of the photoactive compound.

Furthermore, in the photoresist composition of the present invention, the (c) photoactive compound (PAC) is preferably a combined Diazo-naphtoquinone (DNQ) compound of 3 or 4 in the Ballast Group bonded to a benzene ring. The content of the photoactive compound is preferably 3 to 15 wt %.

The (d) solvent used in the present invention plays a role in dissolving the resin and photoactive compound. The solvent is preferably 3-methoxy butyl acrylate (MBA), n-butyl acetate (n-BA), gamma-butyrolactone (GBL), or a mixture thereof, with ethyl lactate. The ethyl lactate is used in order to prevent recrystallization of the photoactive compound, for solubility improvement of n-BA and acrylate, and retention improvement The n-BA is used in order to prevent spots due to having a low boiling point of less than general solvent.

More particularly, the solvent is a mixture of 3-methoxy butyl acrylate, n-butyl acetate, and ethyl lactate. The mixture ratio of 3-methoxy butyl acrylate, n-butyl acetate, and gamma-butyrolactone is preferably in the weight ratio of 30 to 70:20 to 60:1 to 10. Furthermore, the mixture ratio of 3-methoxy butyl acrylate, n-butyl acetate, and ethyl lactate is preferably in the weight ratio of 30 to 70:15 to 40:15 to 50. The content of the solvent is preferably 50 to 80 wt %.

Furthermore, the photoresist composition of the present invention comprises an additive, and as an example it can comprise a surfactant commonly used in the photoresisit composition.

The photoresist composition of the present invention can prepare a semiconductor device by being applied as a mask in an $N^+$ ion doping process and in metal dry etching of a low Poly process in a mass production line.

In the case the photoresist composition is used as a mask in an $N^+$ ion doping process, heat resistance is superior, but $I_{on}/I_{off}$ characteristics can change due to a difference of a doping amount of the ion doping area because of a shrinking phenomenon at the edge of the photoresist after ion doping. This problem can be solved by compensating for the decreased LDD length by making the length of the LDD area that is capable of doping of the $N^-$ ions longer compared with the general metal film. Then, an existence and nonexistence of change decides by confirm the device characteristic, and then a proper LDD length leads, and thereby can reduce a change of $I_{on}/I_{off}$ characteristics due to difference of amount of the ion doping according to shrinkage. Furthermore, according to coating & CD uniformity, LDD length can change after etch, but it can solve through optimization of solvent and surfactant for secure of uniformity of photoresist.

Furthermore, in case of apply in the $N^+$ ion doping process, when ion doping is performed after stripping, a ion bumped into surface part of photoresist is degenerated, and thereby a surface of photoresist degenerated into a real stripper can be occurred residue due to remain without dissolution, but it can be removed by performing an ashing process. That is, in order to prevent contaminants of stripper due to the residue, the present invention can prevent the formation of residue when stripping by removing the degenerated photoresist surface through an ashing treatment. Thus, removal of the photoresist from glass becomes optimal.

Also, in the case of application of the photoresist composition in a metal dry etch process, it is preferable to end up with a profile angle of the photoresist etch process of 45°, by suitably controlling a selection ratio of oxide or metal film and photoresist. That is, in order to maintain a fixed profile angle, suitable control of the component ratio of the photoresist is important, so use of the photoresist composition of the present invention is preferable.

As mentioned, the photoresist composition of the present invention can improve heat resistance by 23% compared with the general photoresist composition, so it can be effectively used as a mask in the case of preparation of a semiconductor device such as an LCD-TFT panel because of its superior photoresist performance since it can endure a high temperature of 160° C. by using a heat resistant main component.

Hereinafter, the present invention is described more in detail through EXAMPLES and COMPARATIVE EXAMPLES. However, the following EXAMPLES are only for the understanding of the present invention, and the present invention is not limited to the following EXAMPLES.

EXAMPLES

Examples 1 to 3 and Comparative Example 1

The photoresist composition was prepared by composition and contents as shown in Table 1, and the composition of the solvent used is shown in Table 2. Furthermore, the photoresist composition of Example 2 was prepared using ethyl lactate instead of gamma-butyrolactone, and content of epoxy acrylate resin was reduced by 1.5%, Example 3 used PPTS instead of epoxy acrylate resin.

TABLE 1

| division (wt %) | | Comp. Example 1 | Example 1 | Example 2 | Example 3 |
|---|---|---|---|---|---|
| Resin | novolak A resin[1] | 8 | — | — | 9.5 |
| | novolak B resin[2] | 7 | 12 | 13.5 | 9.5 |
| | Epoxy acrylate resin | — | 9.5 | 8 | — |
| | PPTS[3] | — | — | — | 3 |
| Photoactive compound[4] (DNQ form) | | 5.5 | 6 | 6 | 6 |
| Solvent | | 79.5 | 72.5 | 72.5 | 72.0 |

TABLE 1-continued

| division (wt %) | | Comp. Example 1 | Example 1 | Example 2 | Example 3 |
|---|---|---|---|---|---|
| Additive | Surfactant[5] (ppm) | 25 | 35 | 35 | 35 |

Annotation)
[1]novolak A resin: weight-average molecular weight of 6700, ratio of m-cresol/p-cresol = 60/40
[2]novolak B resin: weight-average molecular weight of 8200, ratio of m-cresol/p-cresol = 50/50
[3]PPTS: salt of p-toluene sulfonic acid/pyridine
[4]photoactive compound: a compound bonding 3 or 4 diazo-naphtoquinone (DNQ) in the ballast group to a benzene ring.
[5]surfactant: Si-based surfactant.

TABLE 2

| | | Comp. Example 1 | Example 1 | Example 2 | Example 3 |
|---|---|---|---|---|---|
| solvent (wt %) | 3-methoxy butyl acrylate (MBA) | 95 | 55 | 55 | 55 |
| | Gamma-butyrolactone (GBL) | 5 | 5 | — | — |
| | n-butyl acetate (n-BA) | — | 40 | 25 | 25 |
| | Ethyl lactate (EL) | — | — | 25 | 25 |

Experimental Example 1

Application for Ion Doping Process

1. The Strip Test Before Ion Doping

The strip test before ion doping was performed under an immersing condition for 2~10 min in a PRS-2000 stripper at 70° C. by applying the photoresist composition of Example 1 having high heat resistance, and then the strip was evaluated on the basis of the below conditions with no hard bake and with hard bake for 120 sec at 150° C., and the results are shown in Table 3.

0: No trace, good,
Δ: Some trace, dry after,
×: Many traces, dry after.

TABLE 3

| | Immersion Time (Dip Time) (min) | | | |
|---|---|---|---|---|
| | 2 | 3 | 5 | 10 |
| No hard bake | ○ | ○ | ○ | ○ |
| Hard bake | Δ | ○ | ○ | ○ |

As seen in the Table 3, the stripping was shown possible under strip condition of line before ion doing.

Figure 2:
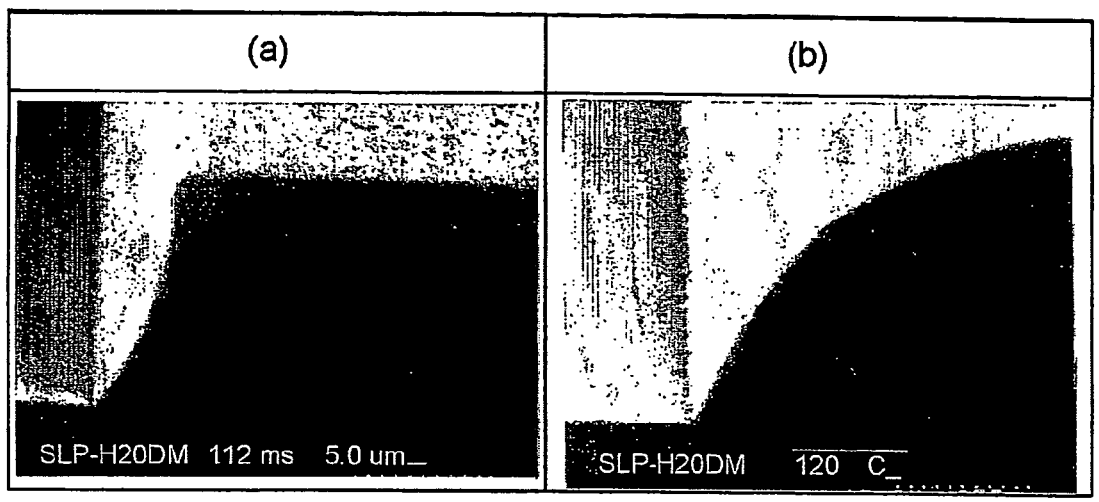
FIG. 2 shows a result of (a) no hard bake, and (b) hard bake for 120 sec. on the photoresist composition of Comparative Example 1 of the related art.
Figure 3:
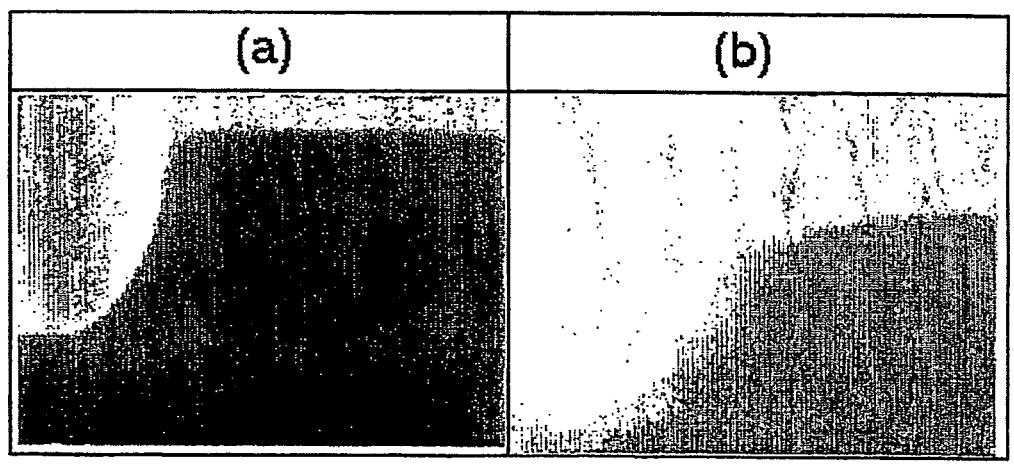
FIG. 3 shows a result of (a) no hard bake, and (b) hard bake for 120 sec. on the photoresist composition of Example 1 of the present invention.

FIGS. 2 and 3 show evaluation results of (a) no hard bake and (b) hard bake for 120 sec for the photoresist composition of Comparative Example 1 and Example 1.

Comparative Example 1 of FIG. 2 shows poor results due to having a lack of heat resistance, but Example 1 of FIG. 3 was improved of 30~40° C. more than 120° C. versus Comparative Example 1b by having superior heat resistance even at a high temperature.

Experiment Example 2

Figure 4:
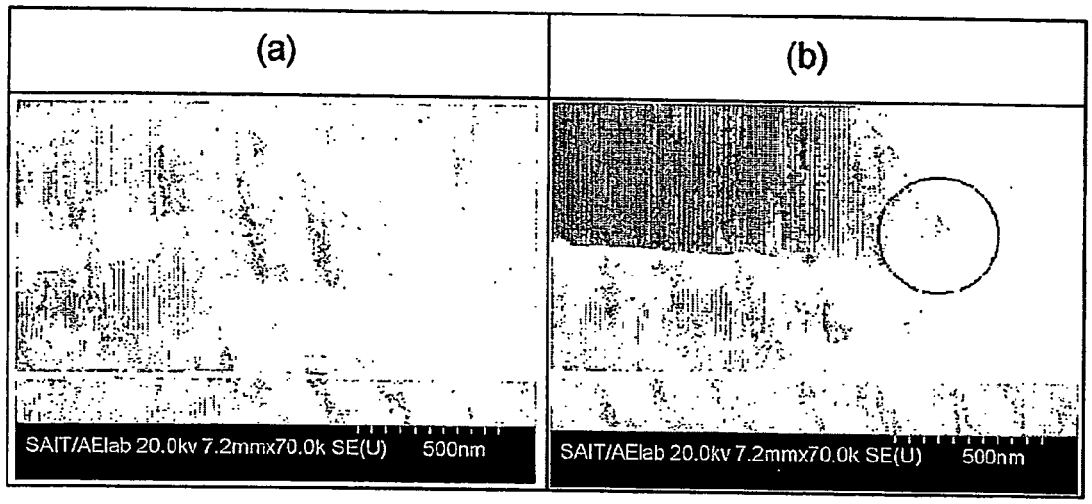
FIG. 4 shows photographs of (a) before ion doping, and (b) after ion doping under a 60 kev energy condition on the photoresist composition of Comparative Example 1 of the related art.
Figure 5:
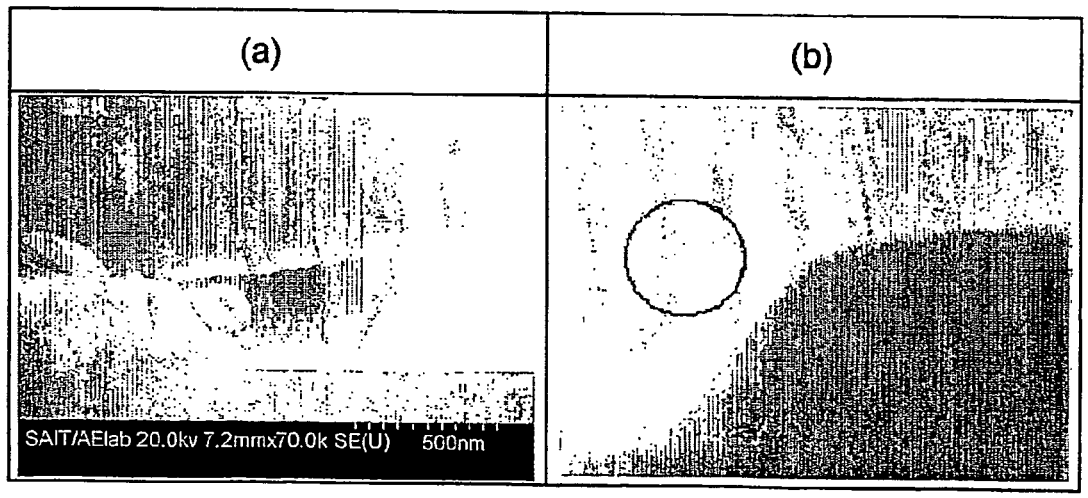
FIG. 5 shows a photograph of (a) before ion doping, and (b) after ion doping under a 60 kev energy condition on the photoresist composition of Example 1 of the present invention.

The photoresist composition of Comparative Example 1 and Example 2 was tested by applying an N$^+$ ion doping process of general Poly Device of a low temperature. FIGS. 4 and 5 show photographs of (a) before ion doping, and (b) after ion doping under an energy condition of 60 kev on Comparative Example 1 and Example 2. As a result, in the case of Comparative Example 1 of FIG. 4, when a shrinkage degree of the photoresist edge part before and after ion doping in a securing state of the LCD length was observed, it is shown that a large slope due to much more shrinkage than Example 2 occurs. This may be because of a changing N$^+$ ion amount after N$^+$ ion doping, and it causes a reduction in heat resistance.

On the contrary, as seen in the results of (a) before ion doping and (b) after ion doping of FIG. 5, Example 2 shows a good state because of superior heat resistance. Also, the retention of Example 2 was improved by 15% (58%→73%).

Experiment Example 3

Figure 6:
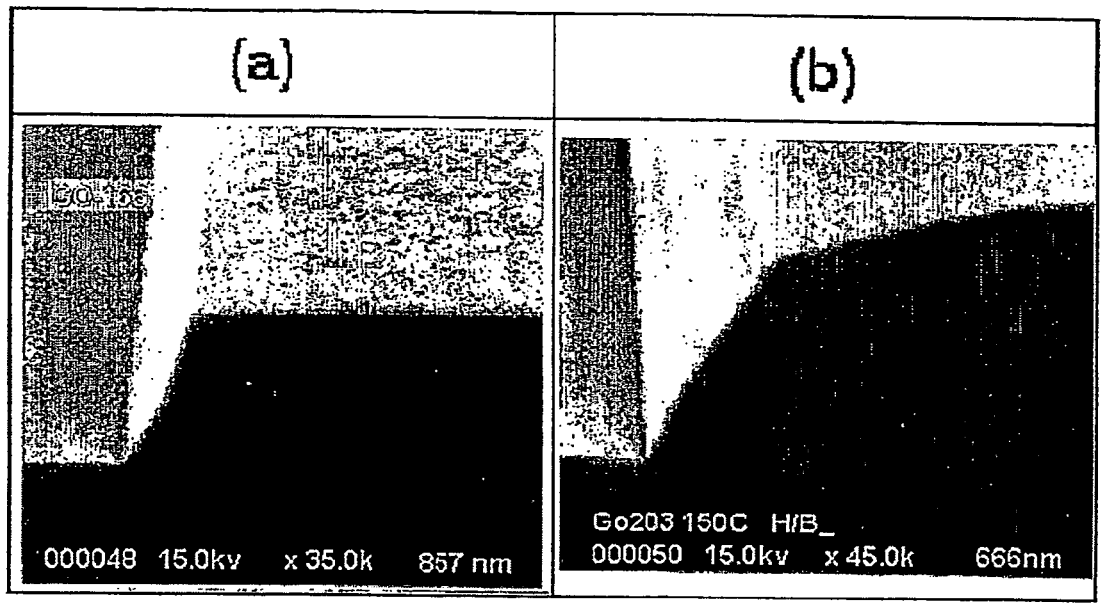
FIG. 6 shows a result of (a) no hard bake, and (b) hard bake for 120 sec. on the photoresist composition of Example 2 of the present invention.
Figure 7:
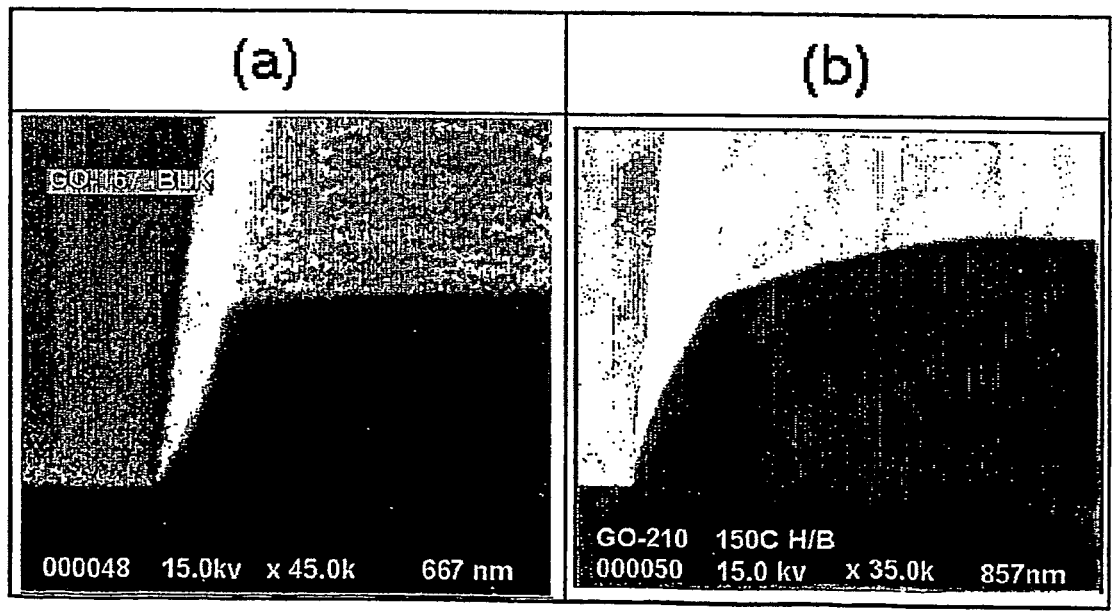
FIG. 7 shows a result of (a) no hard bake, and (b) hard bake for 120 sec. on the photoresist composition of Example 3 of the present invention.

FIGS. 6 and 7 show results of performing (a) no hard bake and (b) hard bake for 120 sec on Examples 2 and 3.

As seen in FIGS. 6 and 7, both of Examples 2 and 3 obtained superior results, and in particular Example 3 had a more superior heat resistance.

Examples 4 to 9 and Comparative Example 2

In order to examine effects of the adding amount of PPTS and novolak resin, the photoresist composition was prepared by changing the adding amount of PPTS and novolak resin with the compositions shown below in Table 4. Here, the remaining percentage was a solvent of Example 3, and an additive was used as a surfactant at 35 ppm.

TABLE 4

| | resin (wt %) | | Sensitivity (mJ) | Retention (%) | Thermal Resistance (° C.) |
|---|---|---|---|---|---|
| | novolak A | novolak B | PPTS | | | |
| Com. Example 2 | — | 19 | — | 100 | 89 | >160 |
| Example 4 | — | 19 | 0.75 | 77.5 | 87 | >160 |
| Example 5 | — | 19 | 1.5 | 60 | 73 | >160 |
| Example 6 | — | 19 | 2.25 | 52 | 58 | >160 |
| Example 7 | 4.4 | 15 | 2.25 | 60 | 83 | >160 |
| Example 8 | 9.5 | 9.5 | 2.25 | 68 | 94 | >160 |
| Example 9 | 9.5 | 9.5 | 3 | 60 | 91 | >160 |

As shown in Table 4, in Examples 4 to 9 the results were generally excellent compared with a case of using only novolak resin of Comparative Example 2, and sensitivity of an equal level compared with general Comparative Example 1 (1500 msec≈60 mJ) was shown. Example 9 maintained heat resistance of 160° C. by using novolak A resin, while remarkably reducing sensitivity by contrast with a balance of retention was obtained improving a record results all sensitivity and retention by using PPTS. In particular, in the aspect of heat resistance, the Examples can maintain performance around 160° C. even without the use of acrylate resin.

Experiment Example 4

Application Test as Mask in Metal Dry Etch Process

The role as a mask was tested in the case of dry etching of an oxide and a metal side in a Poly process on the photoresist composition of Example 9.

Figure 8:
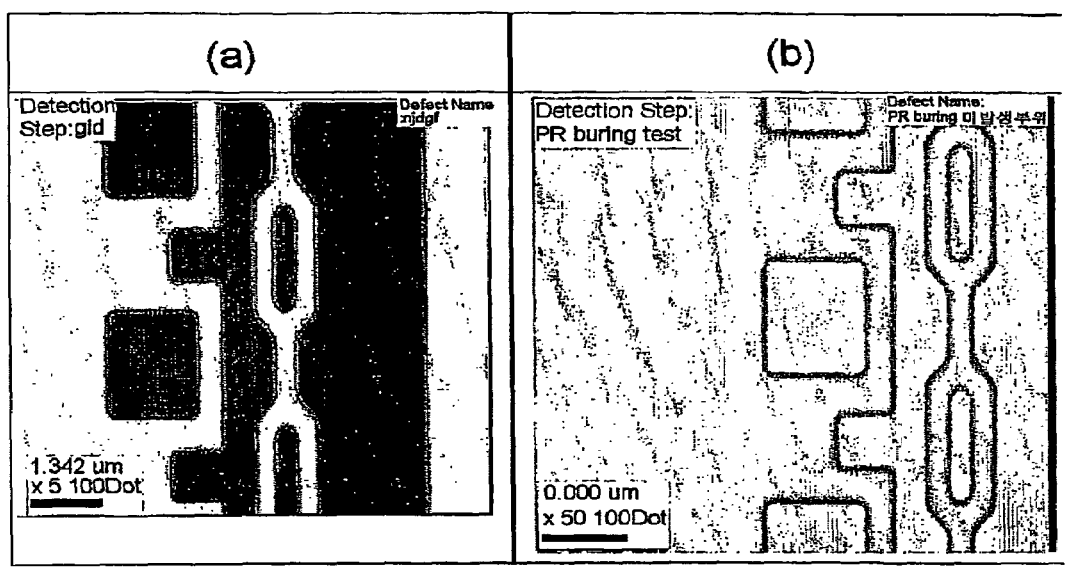
FIG. 8 shows a photograph of (a) before dry etch, and (b) after dry etch for 120 sec. on the photoresist composition of Example 9 of the present invention.

Firstly, after photoresist coating, only a soft bake was done, and a dry etching test was performed. FIG. 8 shows photographs of (a) before dry etch, and (b) after dry etch on Example 9. As seen in FIG. 8, in the case of Example 9 after dry etch, the burning phenomenon generally occurring in the photoresist composition of the prior art (Comparative Example 1) barely appeared.

Furthermore, even when a photo process skipped an additional hard bake process, and then patterning and dry etching was progressed for Example 9, the burning phenomenon on the whole surface of the photoresist did not exist. Also, even after the ashing process, in the case of Example 9, stripping was possible. This expresses that it is possible that the photoresist composition of the present invention can be applied during metal dry etch.

Figure 9:
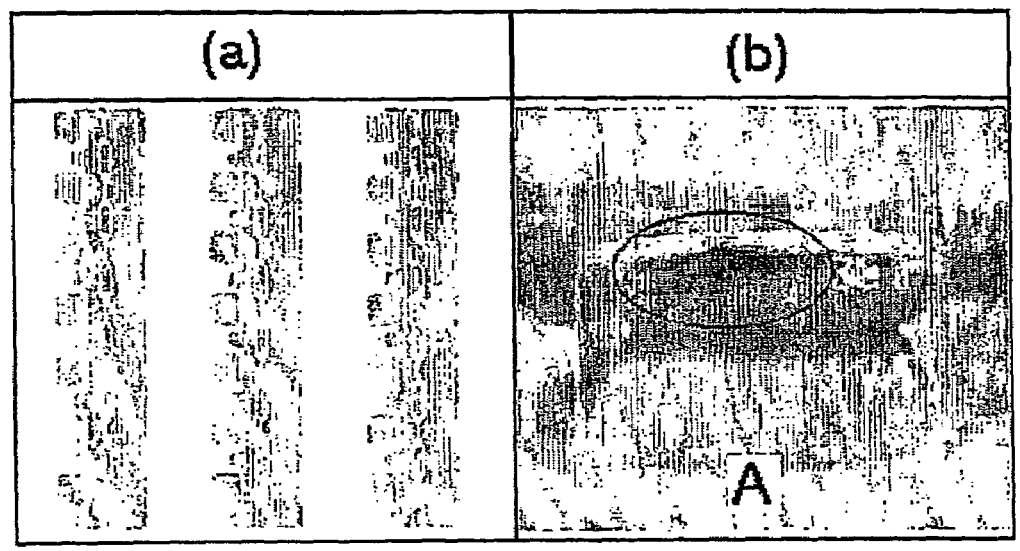
FIG. 9 shows (a) a pattern type, and (b) a resultant dissolved in a strip solution after stripping of the photoresist of Comparative Example 1 of the related art.
Figure 10:
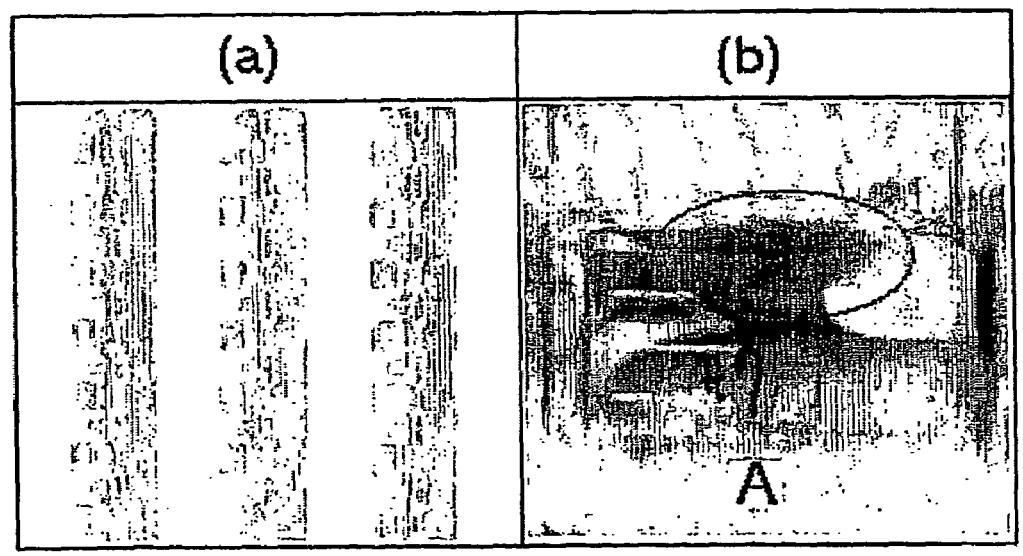
FIG. 10 shows (a) a pattern type, and (b) a resultant dissolved in a strip solution after stripping of the photoresist of Example 9 of the present invention.

FIGS. 9 and 10 show photographs of after stripping of Comparative Example 1 and Example 9. As shown in (a) and (b) of FIG. 9, in the case of Comparative Example 1 although the photoresist on glass plate was not remained, stripping process was not performed due to having a little cured photoresist into stripping solution. On the other hand, as seen in (a) and (b) of FIG. 10, in the case of Example 9 after stripping, the photoresist was cleanly removed without leaving any residue remaining on the metal pattern of the glass plate, and a shell of the cured photoresist surface in the stripping solution was not dissolved and remained. Stripping was carried out under the condition of dipping for 40 seconds at 70° C. with a stripper.

As mentioned above, since the photoresist composition of the present invention has high heat resistance, it has a large effect such as reduction of process tact (a way), process simplification, and the retrenchment of expenditures through making it possible to skip 5 processes, such as Cr metal deposition forming a metal film, and the photo/etch/PR stripping/etch steps of the whole surface of the metal. Furthermore, even the hard bake process can be skipped by substituting the photoresist composition for a general Metal film when applying in the N$^+$ ion doping process during TFT-LCD production.

In addition, although in the case Metal Dry Tech process the etch of Multi-Metal layer (Mo/Al—Nd or Mo/Al—Nd/Mo) can perform Wet etch, reduction of process tact can obtain through dry etch at once due to photoresist characteristic. In this case, the burning phenomenon of the photoresist can be eliminated, and process simplification and retrenchment of expenditures can be obtained through skipping of the hard bake process by using a PR having high heat resistance.

What is claimed is:

1. A photoresist composition comprising:
   (a) 10 to 50 wt % of novolak resin;
   (b) 1 to 20 wt % of epoxy acrylate resin;
   (c) 3 to 15 wt % of. photoactive compound; and
   (d) 50 to 80 wt % of solvent,
   wherein the solvent is a mixture solvent prepared by mixing 3-methoxy butyl acrylate, n-butyl acetate, and gamma-butyrolactone in a weight ratio of 30 to 70:20 to 60:1 to 10.

2. A photoresist composition comprising:
(a) 10 to 50 wt % of novolak resin;
(b) 0.05 to 20 wt % of salt of p-toluene sulfonic acid/pyridine;
(c) 3 to 15 wt % of photoactive compound; and
(d) 50 to 80 wt % of solvent.

3. The photoresist composition according to claim 1, wherein the novolak resin is a mixture of novolak A resin having a weight-average molecular weight of 3,000 to 15,000 and novolak B resin having a weight-average molecular weight of 5,000 to 15,000, or novolak B resin having a weight-average molecular weight of 5,000 to 15,000.

4. The photoresist composition according to claim 3, wherein the mixture ratio of novolak A resin and novolak B resin is in a weight ratio of 1:1 to 9.

5. The photoresist composition according to claim 1, wherein the photoactive compound is a compound of a type bonding 3 or 4 diazo-naphtoquinone (DNQ) to a ballast group bonded with a benzene ring.

6. The photoresist composition according to claim 1, wherein the solvent is a mixture solvent prepared by mixing 3-methoxy butyl acrylate, n-butyl acetate, and ethyl lactate in a weight ration of 30 to 70:15 to 40:15 to 50.

7. A semiconductor device comprising the photoresist composition of claim 1 as a mask in an $N^+$ ion doping process in a low Poly process.

8. A semiconductor device comprising the photoresist composition of claim 1 mask for the metal and nitride dry etch.

9. The photoresist composition according to claim 2, wherein the novolak resin is a mixture of novolak A resin having a weight-average molecular weight of 3,000 to 15,000 and novolak B resin having a weight-average molecular weight of 5,000 to 15,000, or novolak B resin having a weight-average molecular weight of 5,000 to 15,000.

10. The photoresist composition according to claim 9, wherein the mixture ratio of novolak A resin and novolak B resin is in a weight ratio of 1:1 to 9.

11. The photoresist composition according to claim 2, wherein the photoactive compound is a compound of a type bonding 3 or 4 diazo-naphtoquinone (DNQ) to a ballast group bonded with a benzene ring.

12. A semiconductor device comprising the photoresist composition of claim 2 as a mask in an $N^+$ ion doping process in a low Poly process.

13. A semiconductor device comprising the photoresist composition of claim 2 as a mask for the metal and nitride dry etch.

* * * * *